(12) United States Patent
Sun

(10) Patent No.: US 11,943,972 B2
(45) Date of Patent: Mar. 26, 2024

(54) DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Jiajia Sun, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/262,760

(22) PCT Filed: Jun. 17, 2020

(86) PCT No.: PCT/CN2020/096594
§ 371 (c)(1),
(2) Date: Jan. 25, 2021

(87) PCT Pub. No.: WO2021/243753
PCT Pub. Date: Dec. 9, 2021

(65) Prior Publication Data
US 2023/0082402 A1    Mar. 16, 2023

(30) Foreign Application Priority Data
Jun. 2, 2020 (CN) .......................... 202010489698.3

(51) Int. Cl.
*H10K 59/122* (2023.01)
*H10K 50/125* (2023.01)
(Continued)

(52) U.S. Cl.
CPC ......... *H10K 59/122* (2023.02); *H10K 50/125* (2023.02); *H10K 71/00* (2023.02); *H10K 77/111* (2023.02); *H10K 59/1201* (2023.02)

(58) Field of Classification Search
CPC .... H10K 59/122; H10K 50/125; H10K 71/00; H10K 77/111
See application file for complete search history.

(56) References Cited

U.S. PATENT DOCUMENTS

2014/0315339 A1* 10/2014 Kim ..................... H10K 71/611
                                                                 438/34
2014/0354142 A1* 12/2014 Jeong ................... H10K 59/122
                                                                 313/506
(Continued)

FOREIGN PATENT DOCUMENTS

CN          103296052 A       9/2013
CN          106856203 A       6/2017
(Continued)

*Primary Examiner* — Mark W Tornow
(74) *Attorney, Agent, or Firm* — Nathan & Associates; Menachem Nathan

(57) ABSTRACT

The present disclosure provides a display panel and a manufacturing method thereof, which include a flexible substrate, an array layer, a pixel definition layer, an insulating layer, a light-emitting layer, an additional layer, and a first inorganic layer. The array layer, the pixel definition layer, and the insulating layer are sequentially disposed on the flexible substrate, the insulating layer includes first through holes and second through holes, the light-emitting layer is filled in the first through holes, and the additional layer is disposed on the pixel definition layer, in the second through holes, and on the insulating layer and the light-emitting layer. The first inorganic layer is disposed on the array layer and the additional layer.

19 Claims, 4 Drawing Sheets

(51) Int. Cl.
*H10K 59/12* (2023.01)
*H10K 71/00* (2023.01)
*H10K 77/10* (2023.01)

(56) References Cited

U.S. PATENT DOCUMENTS

| | | | |
|---|---|---|---|
| 2014/0374732 A1* | 12/2014 | Jeong | H10K 50/824 |
| | | | 438/34 |
| 2016/0035813 A1* | 2/2016 | Lee | H10K 50/814 |
| | | | 438/23 |
| 2018/0006098 A1* | 1/2018 | Hong | H01L 27/1248 |
| 2019/0229152 A1 | 7/2019 | Wang | |

FOREIGN PATENT DOCUMENTS

| CN | 107394057 A | 11/2017 |
|---|---|---|
| CN | 109103215 A | 12/2018 |
| CN | 110299467 A | 10/2019 |

* cited by examiner

DISPLAY PANEL AND MANUFACTURING METHOD THEREOF

FIELD OF INVENTION

The present disclosure relates to the technical field of display panel, in particular to a display panel and a manufacturing method thereof.

BACKGROUND OF INVENTION

Currently, due to manufacturing process of film layers in a display panel, condition of the film layers is loose, and adhesion between the film layers is weakened after the display panel is bent a certain number of times, thus leading to peeling between the film layers and shortened service life of the display panel.

Technical Problem

The present disclosure provides a display panel and a manufacturing method thereof, to solve the problem of film layers peeling during bending of the display panel in the prior art.

SUMMARY OF INVENTION

The present disclosure provides a display panel, which comprises:
a flexible substrate;
an array layer disposed on the flexible substrate;
a pixel definition layer disposed on the array layer;
an insulating layer disposed on the pixel definition layer, wherein the insulating layer comprises a plurality of first through holes and a plurality of second through holes, the first through holes and the second through holes penetrate the insulating layer and the pixel definition layer to expose the array layer, and material of the insulating layer comprises one or a combination of SiOx and SiNx;
a light-emitting layer disposed in the first through holes;
an additional layer disposed on the pixel definition layer, in the second through holes, and on the insulating layer and the light-emitting layer, wherein the additional layer comprises a plurality of additional portions, the plurality of additional portions are divided into first parts and second parts, the first parts and the second parts are not connected, the first parts are disposed on the pixel definition layer and the light-emitting layer, and the second parts are disposed in the second through holes; and
a first inorganic layer disposed on the array layer and the additional layer.

In the display panel provided in the present disclosure, a distance from one end of each of the second parts to an opposite end of each of the second parts is less than a bottom diameter of the second through hole.

In the display panel provided in the present disclosure, a top diameter of the second through hole is less than a bottom diameter.

In the display panel provided in the present disclosure, the display panel further comprises an organic layer, and the organic layer is disposed on the first inorganic layer.

In the display panel provided in the present disclosure, the display panel further comprises a second inorganic layer, and the second inorganic layer is disposed on the organic layer.

In the display panel provided in the present disclosure, the first through holes and the second through holes are alternately arranged.

In the display panel provided in the present disclosure, material of the pixel definition layer comprises one of acrylic-based materials or epoxy-based materials.

In the display panel provided in the present disclosure, material of the first inorganic layer comprises one or a combination of SiOx, Al2O3, and SiNx.

In the display panel provided in the present disclosure, the light-emitting layer comprises one of a red light-emitting layer, a green light-emitting layer, or a blue light-emitting layer.

The present disclosure further provides a display panel, which comprises:
a flexible substrate;
an array layer disposed on the flexible substrate;
a pixel definition layer disposed on the array layer;
an insulating layer disposed on the pixel definition layer, wherein the insulating layer includes a plurality of first through holes and a plurality of second through holes, the first through holes and the second through holes penetrate the insulating layer and the pixel definition layer to expose the array layer;
a light-emitting layer disposed in the first through holes;
an additional layer disposed on the pixel definition layer, in the second through holes, on the insulating layer and the light-emitting layer, wherein the additional layer comprises a plurality of additional portions, the plurality of additional portions are divided into first parts and second parts, the first parts and the second parts are not connected, the first parts are disposed on the pixel definition layer and the light-emitting layer, and the second parts are disposed in the second through holes; and
a first inorganic layer disposed on the array layer and the additional layer.

In the display panel provided in the present disclosure, a distance from one end of each of the second parts to an opposite end of each of the second parts is less than a bottom diameter of the second through hole.

In the display panel provided in the present disclosure, a top diameter of the second through hole is less than a bottom diameter.

In the display panel provided in the present disclosure, the display panel further comprises an organic layer, and the organic layer is disposed on the first inorganic layer.

In the display panel provided in the present disclosure, the display panel further comprises a second inorganic layer, and the second inorganic layer is disposed on the organic layer.

In the display panel provided in the present disclosure, the first through holes and the second through holes are alternately arranged.

The present disclosure further provides a method of manufacturing a display panel, which comprises:
providing a flexible substrate;
sequentially forming an array layer, a pixel definition layer and an insulating layer on the flexible substrate;
etching the pixel definition layer and the insulating layer to form a plurality of first through holes and a plurality of second through holes, and each of the first through holes and each of the second through holes penetrate the pixel definition layer and the insulating layer to expose the array layer;
forming a light-emitting layer in the first through holes;
evaporating an additional layer material on the pixel definition layer, in the second through holes, and on the insulating layer and the light-emitting layer by an evaporation method to form an additional layer, a plurality of additional portions are divided into first parts and second parts, the first parts and the second parts are not connected, the first parts are disposed on the pixel definition layer and the light-emitting layer, and the second parts are disposed in the second through holes;

forming a first inorganic layer on the array layer, in the second through holes, and on the additional layer.

In the method of manufacturing the display panel provided in the present disclosure, the step of etching the pixel definition layer and the insulating layer to form the plurality of first through holes and the plurality of second through holes, and each of the first through holes and each of the second through holes penetrate the pixel definition layer and the insulating layer to expose the array layer comprises:

exposing and etching the pixel definition layer and the insulating layer to form first pre-made holes and second pre-made holes;

etching the pixel definition layer, the first pre-made holes form first through holes, and the second pre-made holes form second through holes.

In the method of manufacturing the display panel provided in the present disclosure, after the step of forming the first inorganic layer on the array layer, in the second through holes, and on the additional layer, the method comprises:

forming an organic layer on the first inorganic layer.

In the method of manufacturing the display panel provided in the present disclosure, after the step of forming the organic layer on the first inorganic layer, the method comprises:

forming a second inorganic layer on the organic layer.

Beneficial Effect

The present disclosure provides a display panel and a manufacturing method thereof. The display panel comprises a flexible substrate, an array layer, a pixel definition layer, an insulating layer, a light-emitting layer, an additional layer, and a first inorganic layer. The array layer is disposed on the flexible substrate, the pixel definition layer is disposed on the array layer, and the insulating layer is disposed on the pixel definition layer. The insulating layer comprises a plurality of first through holes and a plurality of second through holes, and the first through holes and the second through holes penetrate the insulating layer and the pixel definition layer to expose the array layer. The light-emitting layer is disposed in the first through holes. The additional layer comprises a plurality of additional portions, the plurality of additional portions are divided into first parts and second parts, the first parts and the second parts are not connected, the first parts are disposed on the pixel definition layer and the light-emitting layer, and the second parts are disposed in the second through holes. In the present disclosure, the second parts are disposed in the second through holes, and the first parts and the second parts are not connected, the first inorganic layer is disposed on the array layer and the additional layer, and the first inorganic layer and the array layer cover the second parts, and thus adhesion between the first inorganic layer and the array layer is improved, thereby effectively preventing the array layer and the first inorganic layer from peeling when the display panel is bent, and increasing the service life of the display panel.

DESCRIPTION OF DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DETAILED DESCRIPTION OF PREFERRED EMBODIMENTS

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

Figure 1:
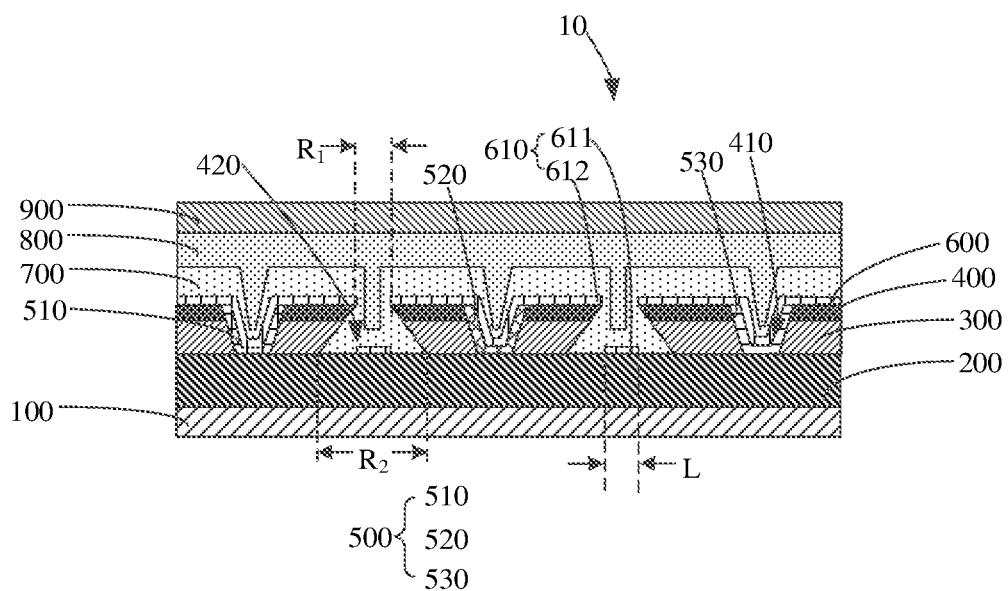
FIG. 1 is a cross-sectional view of a first structure of a display panel provided in the present disclosure.

Please refer to FIG. 1, which is a cross-sectional view of a first structure of a display panel provided in the present disclosure. A display panel 10 is provided in the present disclosure. The display panel 10 comprises a flexible substrate 100, an array layer 200, a pixel definition layer 300, an insulating layer 400, a light-emitting layer 500, an additional layer 600, and a first inorganic layer 700.

Figure 2:
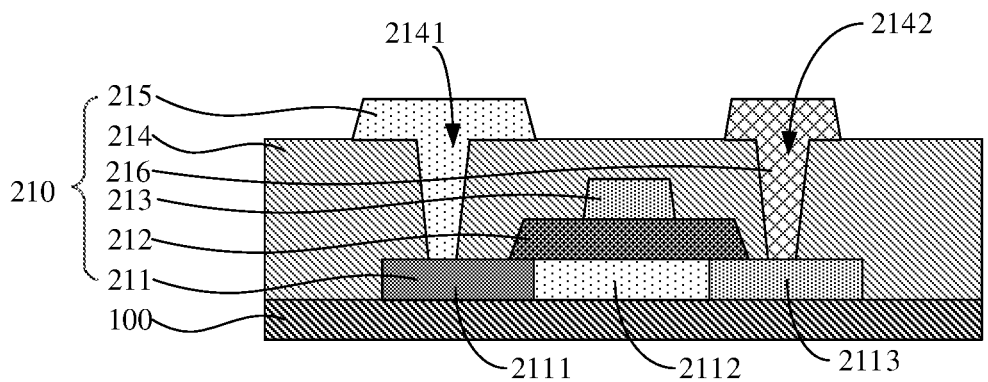
FIG. 2 is a structural cross-sectional view of a flexible substrate and an array layer of the display panel provided in the present disclosure.

Please refer to FIG. 2, which is a structural cross-sectional view of the flexible substrate and the array layer of the display panel provided in the present disclosure. The array layer 200 is disposed on the flexible substrate 100. The array layer 200 comprises a transistor 210. The transistor comprises an active layer 211, a gate insulating layer 212, a gate layer 213, an interlayer dielectric layer 214, a source 215, and a drain 216. The active layer 211 is disposed on the flexible substrate 100. The active layer 211 comprises a P-type doped portion 2111, a semiconductor portion 2112, and an N-type doped portion 2113. The P-type doped portion 2111 and the N-type doped portion 2113 are located on opposite sides of the semiconductor portion 2112. Material of the active layer 211 comprises indium gallium zinc oxide, indium zinc tin oxide, gallium zinc oxide, zinc oxynitride, and indium gallium zinc titanium oxide. The gate insulating layer 212 is disposed on the active layer 211. Material of the gate insulating layer 212 comprises SiOx and SiNx. The gate layer 213 is disposed on the gate insulating layer 212. Material of the gate layer 213 comprises one or a combination of Mo, Al, Cu, and Ti. The interlayer dielectric layer 214 covers the active layer 211, the gate insulting layer 212, and the gate layer 213. The interlayer dielectric layer 214 has a third through hole 2141 and a fourth through hole 2142. The third through hole 2141 penetrates the interlayer dielectric layer 214 to expose one side of the active layer 211. The fourth through hole 2142 penetrates the interlayer dielectric layer 214 to expose the other side of the active layer 211. Material of the interlayer dielectric layer 214 comprises SiOx and SiNx. The source 215 is filled in the third through hole 2141 and on the interlayer dielectric layer 214 to electrically connect to the active layer 211. The drain 216 is filled in the fourth through hole 2142 and on the interlayer dielectric layer 214 to electrically connect to the active layer 211. Material of the source 215 and the drain 216 comprises one or a combination of Mo, Al, Cu, and Ti.

The pixel definition layer 300 is disposed on the array layer 200. Material of the pixel definition layer 300 comprises acrylic-based materials or epoxy-based materials.

The insulating layer 400 is disposed on the pixel definition layer 300. Material of the insulating layer 400 comprises SiOx and SiNx. The insulating layer 400 comprises a plurality of first through holes 410 and a plurality of second through holes 420. The first through holes 410 and the second through holes 420 are alternately arranged. The first through holes 410 and the second through holes 420 penetrate the insulating layer 400 and the pixel definition layer 300 to expose the array layer 200. Top diameters $R_1$ of the second through holes 420 are less than bottom diameters $R_2$.

The light-emitting layer 500 is disposed in the first through holes 410. The light-emitting layer 500 comprises one of a red light-emitting layer 510, a green light-emitting layer 520, or a blue light-emitting layer 530.

The additional layer 600 is disposed on the pixel definition layer 300, in the second through holes 420, and on the insulting layer 400 and the light-emitting layer 500. The additional layer 600 comprises an electron transport layer, an electron injection layer, and a cathode layer. The additional layer 600 comprises a plurality of additional portions 610. The plurality of additional portions 610 are divided into first parts 611 and second parts 612. The first parts 611 and the second parts 612 are not connected. The first parts 611 are disposed on the pixel definition layer 300 and the light-emitting layer 500. The second parts 612 are disposed in the second through holes 420. A distance L from one end of each of the second parts 612 to an opposite end of each of the second parts 612 is less than the bottom diameter $R_2$ of the second through hole 420.

The first inorganic layer 700 is disposed on the array layer 200 and the additional layer 600. Material of the first inorganic layer 700 comprises one or a combination of SiOx, $Al_2O_3$, and SiNx.

In another embodiment, the display panel 10 further comprises an organic layer 800. The organic layer 800 is disposed on the first inorganic layer 700. Material of the organic layer 800 comprises acrylic-based materials or epoxy-based materials.

In another embodiment, the display panel 10 further comprises a second inorganic layer 900. The second inorganic layer 900 is disposed on the organic layer 800. Material of the second inorganic layer comprises one or a combination of SiOx, $Al_2O_3$, and SiNx.

In the present disclosure, the second through holes are set such that the top diameters $R_1$ are less than the bottom diameters $R_2$, and the distance L from one end of each of the second parts in the second through hole to an opposite end of the second part is less than the bottom diameter $R_2$ of the second through hole, so that the second parts do not completely fill the second through holes and expose part of the array layer. In addition, the first inorganic layer is disposed on the array layer and the additional layer, and the second parts in the second through holes are covered by the first inorganic layer and the array layer, adhesion between the array layer and the first inorganic layer is very strong since the two are formed of inorganic materials, and thus peeling of film layers are reduced during bending of the display panel, thereby improving the service life of the display panel.

Figure 3:
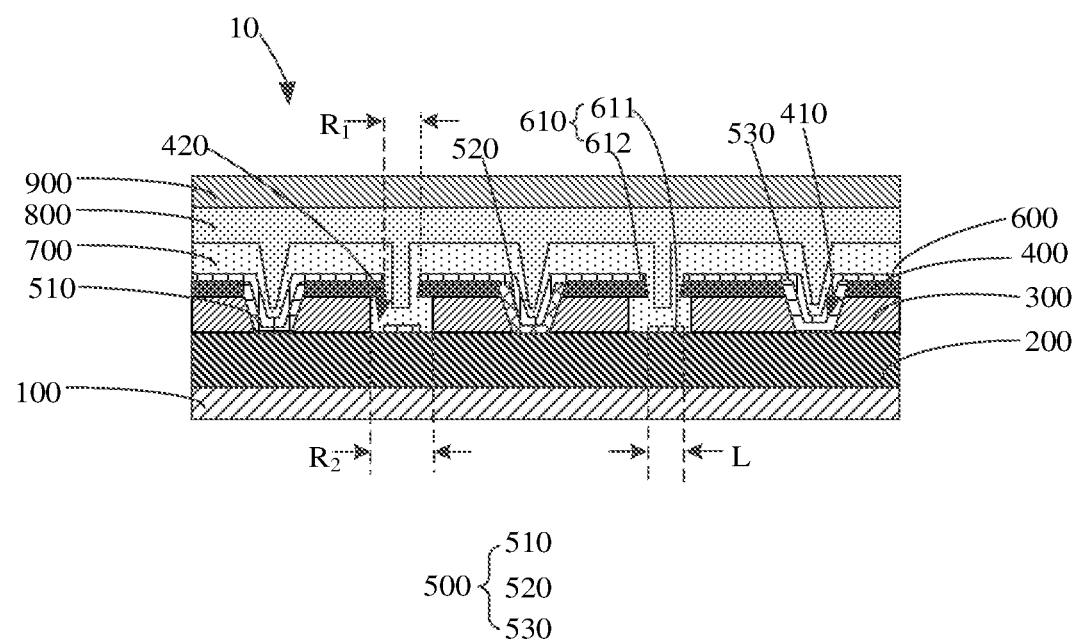
FIG. 3 is a cross-sectional view of a second structure of the display panel provided in the present disclosure.

FIG. 3 is a cross-sectional view of a second structure of the display panel provided in the present disclosure. Ends of the first parts 611 and ends of the adjacent first parts 611 are partially suspended.

Figure 4:
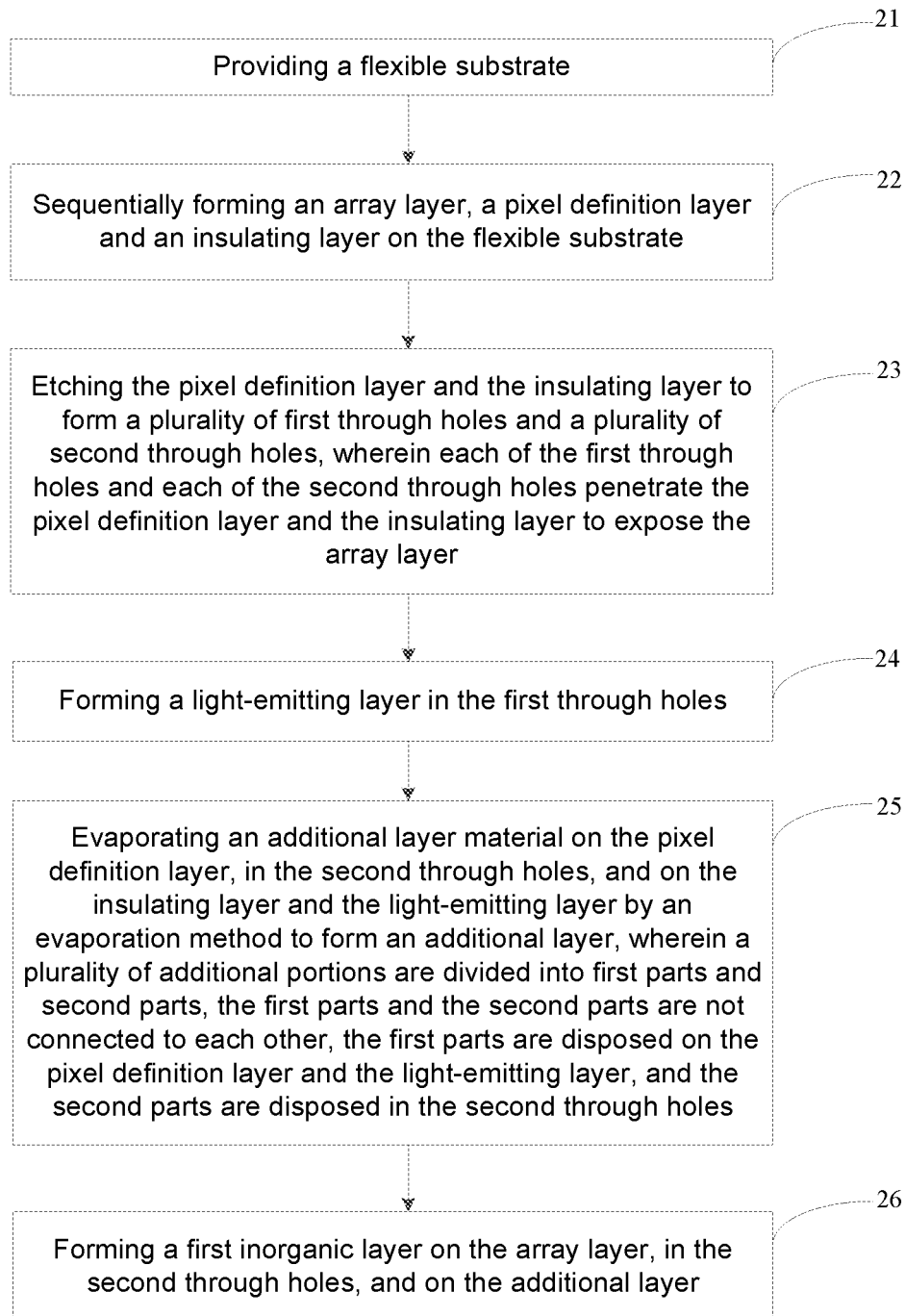
FIG. 4 is a flowchart of a method of manufacturing a display panel provided in the present disclosure.
Figure 5:
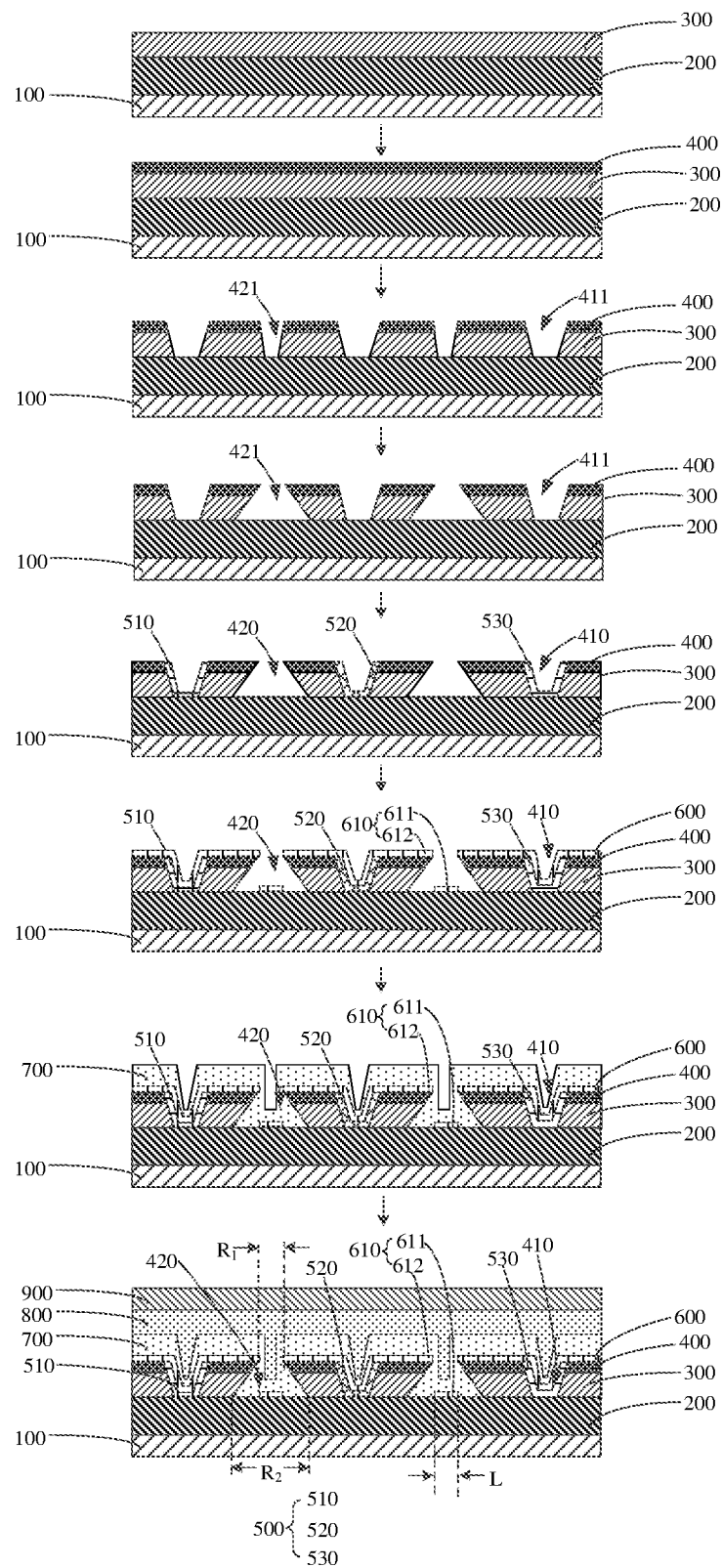
FIG. 5 is a flow cross-sectional view of the method of manufacturing the display panel provided in the present disclosure.

Please refer to FIG. 4 and FIG. 5, FIG. 4 is a flowchart of a method of manufacturing a display panel provided in the present disclosure. FIG. 5 is a flow cross-sectional view of the method of manufacturing the display panel provided in the present disclosure. The present disclosure further provides the method of manufacturing the display panel, which comprises following steps:

21, a flexible substrate 100 is provided.

22, an array layer 200, a pixel definition layer 300, and an insulating layer 400 are sequentially formed on the flexible substrate 100.

Material of the pixel definition layer 300 comprises acrylic-based materials or epoxy-based materials. Material of the insulating layer 400 comprises SiOx and SiNx.

23, the pixel definition layer 300 and the insulating layer 400 are etched to form a plurality of first through holes 410 and a plurality of second through holes 420, and each of the first through holes 410 and each of the second through holes 420 penetrate the pixel definition layer 300 and the insulating layer 400 to expose the array layer 200.

Specifically, the pixel definition layer 300 and the insulating layer 400 are exposed to light and first pre-made holes 411 and second pre-made holes 421 are formed by etching. Then, the pixel definition layer 300 is etched. The first pre-made holes 411 form the first through holes 410. The second pre-made holes 421 form the second through holes 420. The first through holes 410 and the second through holes 420 are alternately arranged. Top diameters $R_1$ of the second through holes 420 are less than bottom diameters $R_2$.

24, a light-emitting layer 500 is formed in the first through holes 410.

Specifically, a light-emitting material is evaporated in the first through holes 410 to form the light-emitting layer 500. The light-emitting layer 500 comprises one of a red light-emitting layer 510, a green light-emitting layer 520, or a blue light-emitting layer 530.

25, an additional layer material is evaporated on the pixel definition layer 300, in the second through holes 420, and on the insulating layer 400 and the light-emitting layer 500 by an evaporation method to form an additional layer 600. A plurality of additional portions 610 are divided into first parts 611 and second parts 612, the first parts 611 and the second parts 612 are not connected. The first parts 611 are disposed on the pixel definition layer 300 and the light-emitting layer 500, and the second parts 612 are disposed in the second through holes 420.

Specifically, the additional layer 600 comprises an electron transport layer, an electron injection layer, and a cathode layer. A distance L from one end of each of the second parts 612 to an opposite end of the second part 612 is less than the bottom diameter $R_2$ of the second through hole 420.

26, a first inorganic layer 700 covers the array layer 200, the second through holes 420, and the additional layer 600.

Specifically, a first inorganic layer material is disposed on the array layer 200, in the second through holes 420, and on the additional layer 600 to form the first inorganic layer 700. Material of the first inorganic layer 700 comprises one or a combination of SiOx, $Al_2O_3$, and SiNx.

After the step of forming the first inorganic layer 700 on the array layer 200, in the second through holes 420, and on the additional layer 600, the method further comprises disposing an organic layer material on the first inorganic layer 700 to form an organic layer 800. Material of the organic layer 800 comprises acrylic-based materials or epoxy-based materials.

After the step of forming the organic layer 800 on the first inorganic layer 700, the method further comprises disposing a second inorganic layer material on the organic layer 800 to form a second inorganic layer 900. Material of the second inorganic layer comprises one or a combination of SiOx, $Al_2O_3$, and SiNx.

The present disclosure provides a display panel and a manufacturing method thereof. In the display panel, the second through holes are set such that the top diameters $R_1$ are less than the bottom diameters $R_2$, and the distance L from one end of each of the second parts in the second through hole to an opposite end of the second part is less than the bottom diameter $R_2$ of the second through hole, so that the second parts do not completely fill the second through holes and expose part of the array layer. In addition, the first inorganic layer is disposed on the array layer and the additional layer, and the second parts in the second through holes are covered by the first inorganic layer and the array layer. The adhesion between the array layer and the first inorganic layer is very strong since the two are formed of inorganic materials, and thus peeling of film layers are reduced during bending of the display panel, thereby improving the service life of the display panel.

The above are only examples of the present disclosure and do not limit the scope of the present disclosure. Any equivalent structure or equivalent process transformation made using the description and drawings of the present disclosure, or directly or indirectly applied to other related technical fields, are included in the scope of patent protection of the present disclosure.

What is claimed is:

1. A display panel, comprising:
   a flexible substrate;
   an array layer disposed on the flexible substrate;
   a pixel definition layer disposed on the array layer;
   an insulating layer disposed on the pixel definition layer, wherein the insulating layer comprises a plurality of first through holes and a plurality of second through holes, the first through holes and the second through holes penetrate the insulating layer and the pixel definition layer to expose the array layer, and material of the insulating layer comprises one or a combination of SiOx and SiNx;
   a light-emitting layer disposed in the first through holes;
   an additional layer disposed on the pixel definition layer, in the second through holes, and on the insulating layer and the light-emitting layer, wherein the additional layer comprises a plurality of additional portions, the plurality of additional portions are divided into first parts and second parts, the first parts and the second parts are not connected to each other, the first parts are disposed on the pixel definition layer and the light-emitting layer, and the second parts are disposed in the second through holes; and
   a first inorganic layer disposed on the array layer and the additional layer.

2. The display panel of claim 1, wherein a distance from one end of each of the second parts to an opposite end of each of the second parts is less than a bottom diameter of the second through holes.

3. The display panel of claim 1, wherein a top diameter of the second through holes is less than a bottom diameter.

4. The display panel of claim 1, wherein the display panel further comprises an organic layer, and the organic layer is disposed on the first inorganic layer.

5. The display panel of claim 4, wherein the display panel further comprises a second inorganic layer, and the second inorganic layer is disposed on the organic layer.

6. The display panel of claim 1, wherein the first through holes and the second through holes are alternately arranged.

7. The display panel of claim 1, wherein material of the pixel definition layer comprises one of acrylic-based materials or epoxy-based materials.

8. The display panel of claim 1, wherein material of the first inorganic layer comprises one or a combination of SiOx, Al2O3, and SiNx.

9. The display panel of claim 1, wherein the light-emitting layer comprises one of a red light-emitting layer, a green light-emitting layer, or a blue light-emitting layer.

10. A display panel, comprising:
    a flexible substrate;
    an array layer disposed on the flexible substrate;
    a pixel definition layer disposed on the array layer;
    an insulating layer disposed on the pixel definition layer, wherein the insulating layer comprises a plurality of first through holes and a plurality of second through holes, and the first through holes and the second through holes penetrate the insulating layer and the pixel definition layer to expose the array layer;
    a light-emitting layer disposed in the first through holes;
    an additional layer disposed on the pixel definition layer, in the second through holes, and on the insulating layer and the light-emitting layer, wherein the additional layer comprises a plurality of additional portions, the plurality of additional portions are divided into first parts and second parts, the first parts and the second parts are not connected to each other, the first parts are disposed on the pixel definition layer and the light-emitting layer, and the second parts are disposed in the second through holes; and
    a first inorganic layer disposed on the array layer and the additional layer.

11. The display panel of claim 10, wherein a distance from one end of each of the second parts to an opposite end of each of the second parts is less than a bottom diameter of the second through holes.

12. The display panel of claim 10, wherein a top diameter of the second through holes is less than a bottom diameter.

13. The display panel of claim 10, wherein the display panel further comprises an organic layer, and the organic layer is disposed on the first inorganic layer.

14. The display panel of claim 13, wherein the display panel further comprises a second inorganic layer, and the second inorganic layer is disposed on the organic layer.

15. The display panel of claim 10, wherein the first through holes and the second through holes are alternately arranged.

16. A method of manufacturing a display panel, comprising following steps:
    providing a flexible substrate;
    sequentially forming an array layer, a pixel definition layer, and an insulating layer on the flexible substrate;
    etching the pixel definition layer and the insulating layer to form a plurality of first through holes and a plurality of second through holes, wherein each of the first through holes and each of the second through holes penetrate the pixel definition layer and the insulating layer to expose the array layer;
    forming a light-emitting layer in the first through holes;

evaporating an additional layer material on the pixel definition layer, in the second through holes, and on the insulating layer and the light-emitting layer by an evaporation method to form an additional layer, wherein a plurality of additional portions are divided into first parts and second parts, the first parts and the second parts are not connected to each other, the first parts are disposed on the pixel definition layer and the light-emitting layer, and the second parts are disposed in the second through holes; and forming a first inorganic layer on the array layer, in the second through holes, and on the additional layer.

17. The method of manufacturing the display panel of claim 16, wherein the step of etching the pixel definition layer and the insulating layer to form the plurality of first through holes and the plurality of second through holes, wherein each of the first through holes and each of the second through holes penetrate the pixel definition layer and the insulating layer to expose the array layer comprises:

exposing and etching the pixel definition layer and the insulating layer to form first pre-made holes and second pre-made holes; and etching the pixel definition layer so that the first pre-made holes form the first through holes, and the second pre-made holes form the second through holes.

18. The method of manufacturing the display panel of claim 16, wherein after the step of forming the first inorganic layer on the array layer, in the second through holes, and on the additional layer, the method comprises:

forming an organic layer on the first inorganic layer.

19. The method of manufacturing the display panel of claim 18, wherein after the step of forming the organic layer on the first inorganic layer, the method comprises:

forming a second inorganic layer on the organic layer.

* * * * *